United States Patent
Behringer et al.

(10) Patent No.: US 12,206,058 B2
(45) Date of Patent: Jan. 21, 2025

(54) METHOD FOR PRODUCING OPTOELECTRONIC SEMICONDUCTOR DEVICES AND OPTOELECTRONIC SEMICONDUCTOR DEVICE

(71) Applicant: OSRAM Opto Semiconductors GmbH, Regensburg (DE)

(72) Inventors: Martin Rudolf Behringer, Regensburg (DE); Christoph Klemp, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 459 days.

(21) Appl. No.: 17/435,975

(22) PCT Filed: Mar. 5, 2020

(86) PCT No.: PCT/EP2020/055889
§ 371 (c)(1),
(2) Date: Sep. 2, 2021

(87) PCT Pub. No.: WO2020/182621
PCT Pub. Date: Sep. 17, 2020

(65) Prior Publication Data
US 2022/0140216 A1 May 5, 2022

(30) Foreign Application Priority Data
Mar. 14, 2019 (DE) ...................... 10 2019 106 546.1

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0753* (2013.01); *H01L 33/005* (2013.01);
(Continued)

(58) Field of Classification Search
CPC ......... H01L 33/36; H01L 33/40; H01L 33/38; H01L 33/382; H01L 33/385;
(Continued)

(56) References Cited

U.S. PATENT DOCUMENTS 6,287,947 B1 * 9/2001 Ludowise ............. H01S 5/0421
438/606
6,417,019 B1 * 7/2002 Mueller ............ C09K 11/7731
257/788

(Continued)

FOREIGN PATENT DOCUMENTS

DE 112015005124 T5 8/2017
DE 102018115976 A1 1/2019
(Continued)

OTHER PUBLICATIONS

DUPONT PE410, "Ink-Jet Silver Conductor," DUPONT, 2018, p. 1-2.
(Continued)

*Primary Examiner* — Sophia T Nguyen
(74) *Attorney, Agent, or Firm* — Slater Matsil, LLP

(57) ABSTRACT

In an embodiment a method for producing optoelectronic semiconductor devices includes providing at least one optoelectronic semiconductor chip with at least one contact side, generating at least one coating region and at least one protection region on the contact side or on at least one of the contact sides, applying at least one liquid coating material to the at least one contact side, wherein the at least one coating material wets the at least one coating region and does not wet the at least one protection region and solidifying the at least one coating material into at least one electrical contact structure on the at least one coating region such that the semiconductor chip is capable of being energized through the at least one contact structure.

17 Claims, 7 Drawing Sheets

(51) Int. Cl.
*H01L 33/00* (2010.01)
*H01L 33/22* (2010.01)
*H01L 33/44* (2010.01)
*H01L 33/48* (2010.01)

(52) U.S. Cl.
CPC .............. *H01L 33/22* (2013.01); *H01L 33/44* (2013.01); *H01L 33/486* (2013.01); *H01L 2933/0025* (2013.01); *H01L 2933/0066* (2013.01)

(58) Field of Classification Search
CPC ....... H01L 33/387; H01L 33/22; H01L 33/24; H01L 33/20; H01L 2933/00; H01L 2933/0008; H01L 2933/0016; H01L 2933/0025; H01L 2933/0058; H01L 2933/0083; H01L 21/283; H01L 21/288; H01L 21/28562; H01L 24/11
See application file for complete search history.

(56) References Cited

U.S. PATENT DOCUMENTS

| | | | | |
|---|---|---|---|---|
| 6,492,251 B1* | 12/2002 | Haba | ................ | H01L 24/72 257/E21.511 |
| 6,501,663 B1* | 12/2002 | Pan | ................ | H01L 24/97 257/E21.174 |
| 6,696,225 B1* | 2/2004 | Kanbe | ................ | B41M 5/368 347/105 |
| 6,730,212 B1* | 5/2004 | Yamagishi | ................ | G01N 27/126 204/403.01 |
| 7,008,524 B2* | 3/2006 | Stanford | ................ | C12Q 1/001 205/792 |
| 7,070,701 B2* | 7/2006 | Takagi | ................ | G02B 5/201 257/E21.174 |
| 7,119,026 B2* | 10/2006 | Honda | ................ | B41J 2/1433 438/748 |
| 7,214,617 B2* | 5/2007 | Hirai | ................ | H01L 27/1292 438/30 |
| 7,326,585 B2* | 2/2008 | Hirai | ................ | H01L 21/76838 438/149 |
| 7,501,156 B2* | 3/2009 | Nakabayashi | ................ | B41J 2/1606 427/256 |
| 7,501,657 B2* | 3/2009 | Nagai | ................ | F21V 17/005 257/79 |
| 7,655,566 B2* | 2/2010 | Fujii | ................ | H01L 21/0272 257/E21.44 |
| 7,678,697 B2* | 3/2010 | Hirai | ................ | C03C 17/3411 438/674 |
| 7,732,330 B2* | 6/2010 | Fujii | ................ | H01L 29/458 257/E21.174 |
| 7,932,534 B2* | 4/2011 | Singh | ................ | H01L 33/007 257/E31.094 |
| 8,274,070 B2* | 9/2012 | Kamiya | ................ | H01L 33/40 257/E33.012 |
| 9,349,712 B2* | 5/2016 | Yu | ................ | H01L 33/62 |
| 10,249,798 B2 | 4/2019 | Kim et al. | | |
| 10,840,419 B2* | 11/2020 | Sun | ................ | H01L 33/0075 |
| 10,879,426 B2* | 12/2020 | Hoeppel | ................ | H01L 33/56 |
| 10,984,702 B2* | 4/2021 | Hsieh | ................ | H01L 33/38 |
| 11,177,420 B2* | 11/2021 | Lopez-Julia | ................ | H01L 33/44 |
| 11,423,830 B2* | 8/2022 | Hsieh | ................ | H01L 33/38 |
| 11,437,352 B2* | 9/2022 | Kim | ................ | H01L 25/0753 |
| 11,726,184 B2* | 8/2023 | Ferreira | ................ | G01S 17/86 356/4.01 |
| 2001/0018266 A1* | 8/2001 | Jiang | ................ | H01L 21/7685 257/E21.228 |
| 2002/0151161 A1* | 10/2002 | Furusawa | ................ | H05K 3/1208 257/E21.174 |
| 2003/0047745 A1* | 3/2003 | Suzuki | ................ | H01L 33/30 257/E33.074 |
| 2003/0059686 A1* | 3/2003 | Kobayashi | ................ | G03F 7/0042 430/7 |
| 2003/0062263 A1* | 4/2003 | Stanford | ................ | G01N 27/3276 204/403.01 |
| 2003/0062530 A1* | 4/2003 | Okazaki | ................ | H01L 33/20 257/E33.068 |
| 2003/0083203 A1* | 5/2003 | Hashimoto | ................ | B41J 3/407 257/E21.174 |
| 2004/0031515 A1* | 2/2004 | Sadatomi | ................ | H10N 10/17 136/239 |
| 2004/0082163 A1* | 4/2004 | Mori | ................ | H01L 21/3127 257/E21.174 |
| 2004/0203235 A1* | 10/2004 | Miyakawa | ................ | H01L 21/76873 257/E29.147 |
| 2004/0209190 A1* | 10/2004 | Mori | ................ | H01L 21/288 430/311 |
| 2005/0007398 A1* | 1/2005 | Hirai | ................ | H10K 71/60 257/E21.174 |
| 2005/0009298 A1* | 1/2005 | Suzuki | ................ | H01L 24/05 438/464 |
| 2005/0029666 A1* | 2/2005 | Kurihara | ................ | H01L 24/81 257/772 |
| 2005/0064633 A1* | 3/2005 | Mikoshiba | ................ | C23C 4/123 438/161 |
| 2005/0072982 A1* | 4/2005 | Strauss | ................ | H01L 33/38 257/94 |
| 2005/0082562 A1* | 4/2005 | Ou | ................ | H01L 33/22 257/E33.074 |
| 2005/0098775 A1* | 5/2005 | Kondo | ................ | H01L 24/24 257/E21.174 |
| 2005/0245079 A1* | 11/2005 | Honda | ................ | B41J 2/1433 438/676 |
| 2006/0088998 A1* | 4/2006 | Moriya | ................ | H05K 3/1258 257/E21.585 |
| 2006/0110908 A1* | 5/2006 | Moriya | ................ | H01L 21/7685 257/E21.174 |
| 2006/0202219 A1* | 9/2006 | Ohashi | ................ | H01L 24/32 257/E33.068 |
| 2006/0231852 A1* | 10/2006 | Kususe | ................ | H01L 33/62 257/79 |
| 2007/0241260 A1* | 10/2007 | Jaeger | ................ | H01L 31/035209 250/214.1 |
| 2008/0035944 A1* | 2/2008 | Eberhard | ................ | H01L 33/44 257/E33.071 |
| 2008/0061717 A1* | 3/2008 | Bogner | ................ | B60Q 1/0023 257/E25.032 |
| 2008/0277682 A1* | 11/2008 | Mishra | ................ | H01L 33/22 257/E33.001 |
| 2008/0290351 A1* | 11/2008 | Ajiki | ................ | H01L 33/50 257/E33.061 |
| 2008/0315229 A1* | 12/2008 | Yi | ................ | H01L 33/387 257/E33.001 |
| 2009/0050926 A1* | 2/2009 | Suehiro | ................ | H01L 33/486 257/E33.059 |
| 2009/0085095 A1* | 4/2009 | Kamath | ................ | H01L 21/02532 438/479 |
| 2009/0127573 A1* | 5/2009 | Guenther | ................ | H01L 24/24 257/E33.061 |
| 2009/0160045 A1* | 6/2009 | Sun | ................ | H01L 21/6835 438/114 |
| 2009/0232969 A1* | 9/2009 | Hayton | ................ | H01L 21/288 427/58 |
| 2009/0242903 A1* | 10/2009 | Maier-Richter | ................ | F21K 9/00 257/E33.059 |
| 2010/0060553 A1* | 3/2010 | Zimmerman | ................ | H01L 25/0753 345/60 |
| 2010/0096615 A1* | 4/2010 | Okamoto | ................ | H01L 33/405 257/13 |
| 2010/0163915 A1* | 7/2010 | Herrmann | ................ | H01L 33/642 257/E33.075 |
| 2010/0264443 A1* | 10/2010 | Wakai | ................ | H01L 33/005 257/98 |
| 2010/0276722 A1* | 11/2010 | Baur | ................ | H01L 24/24 438/26 |
| 2010/0308359 A1* | 12/2010 | Singh | ................ | H01L 33/22 257/E33.074 |
| 2011/0012154 A1* | 1/2011 | Okagawa | ................ | H01L 33/42 257/749 |

(56) References Cited

U.S. PATENT DOCUMENTS

| | | | |
|---|---|---|---|
| 2011/0024789 A1* | 2/2011 | Yao | H01L 33/387 |
| | | | 257/E33.074 |
| 2011/0073894 A1* | 3/2011 | Chu | H01L 33/22 |
| | | | 257/E33.068 |
| 2011/0089401 A1* | 4/2011 | Hiraiwa | H01L 33/405 |
| | | | 257/E33.072 |
| 2011/0284158 A1* | 11/2011 | Katsumura | H01L 24/11 |
| | | | 156/356 |
| 2011/0316016 A1* | 12/2011 | Lin | H01L 25/0753 |
| | | | 257/E33.065 |
| 2012/0171858 A1* | 7/2012 | Iwatsu | H01L 21/76898 |
| | | | 438/612 |
| 2012/0193648 A1* | 8/2012 | Donofrio | H01L 33/508 |
| | | | 257/E33.056 |
| 2012/0305889 A1* | 12/2012 | Lim | H01L 33/405 |
| | | | 257/13 |
| 2013/0001810 A1* | 1/2013 | Asuke | B41J 2/1623 |
| | | | 438/455 |
| 2013/0011577 A1* | 1/2013 | Hwang | H01L 21/268 |
| | | | 977/734 |
| 2013/0052366 A1* | 2/2013 | Chen | H01L 21/288 |
| | | | 427/535 |
| 2013/0187178 A1* | 7/2013 | Tischler | H01L 25/0753 |
| | | | 257/88 |
| 2013/0208026 A1* | 8/2013 | Suzuki | H01L 25/0753 |
| | | | 257/99 |
| 2013/0248816 A1* | 9/2013 | Chu | H01L 33/22 |
| | | | 438/47 |
| 2013/0248907 A1* | 9/2013 | Kato | H01L 33/62 |
| | | | 438/22 |
| 2013/0256854 A1 | 10/2013 | Kobayashi et al. | |
| 2013/0320385 A1* | 12/2013 | Ahlstedt | G02B 5/00 |
| | | | 257/98 |
| 2014/0001483 A1* | 1/2014 | Rand | H01L 33/405 |
| | | | 438/29 |
| 2014/0061664 A1* | 3/2014 | Joichi | H01L 33/405 |
| | | | 257/76 |
| 2014/0299901 A1* | 10/2014 | Chi | H01L 33/22 |
| | | | 257/95 |
| 2015/0008471 A1* | 1/2015 | Gallmeier | H01L 33/507 |
| | | | 257/98 |
| 2015/0050760 A1* | 2/2015 | Imazu | H01L 24/96 |
| | | | 438/27 |
| 2015/0084081 A1* | 3/2015 | Kim | H01L 33/22 |
| | | | 438/27 |
| 2015/0207046 A1* | 7/2015 | Ikegami | H01L 33/505 |
| | | | 438/27 |
| 2015/0228696 A1* | 8/2015 | Diekmann | F21V 33/0012 |
| | | | 257/40 |
| 2015/0228850 A1* | 8/2015 | Zheng | H01L 33/305 |
| | | | 257/13 |
| 2015/0280074 A1* | 10/2015 | Lee | H01L 33/44 |
| | | | 257/98 |
| 2015/0311405 A1* | 10/2015 | Oyamada | H01L 33/36 |
| | | | 438/27 |
| 2015/0333227 A1* | 11/2015 | Lee | H01L 33/56 |
| | | | 438/27 |
| 2015/0338081 A1* | 11/2015 | McGowan | F21V 23/005 |
| | | | 362/382 |
| 2015/0349200 A1 | 12/2015 | Chen et al. | |
| 2015/0362165 A1* | 12/2015 | Chu | H01L 33/32 |
| | | | 362/235 |
| 2016/0122637 A1* | 5/2016 | Pohl-Klein | C09K 11/77347 |
| | | | 252/301.4 R |
| 2016/0133788 A1* | 5/2016 | Kim | H01L 33/20 |
| | | | 257/79 |
| 2017/0005079 A1* | 1/2017 | Hoeppel | H01L 25/167 |
| 2017/0092820 A1* | 3/2017 | Kim | H01L 25/0753 |
| 2017/0098742 A1* | 4/2017 | Ikegami | H01L 33/46 |
| 2017/0186911 A1* | 6/2017 | Otto | H01L 33/08 |
| 2017/0200873 A1* | 7/2017 | Nakabayashi | H01L 33/005 |
| 2018/0047876 A1* | 2/2018 | Chu | H01L 27/156 |
| 2018/0108811 A1* | 4/2018 | Kopp | H01L 33/382 |
| 2018/0108852 A1* | 4/2018 | Nishikawa | H10K 59/131 |
| 2018/0190874 A1* | 7/2018 | Katz | H01L 33/12 |
| 2018/0219145 A1* | 8/2018 | Unterburger | H01L 21/561 |
| 2018/0301873 A1* | 10/2018 | Singer | H01S 5/227 |
| 2018/0331251 A1* | 11/2018 | Scholz | H01L 33/405 |
| 2018/0358510 A1* | 12/2018 | Kopp | H01L 33/0075 |
| 2018/0366318 A1* | 12/2018 | Ouyang | B05D 3/0254 |
| 2019/0013450 A1 | 1/2019 | Ploessl | |
| 2019/0013451 A1* | 1/2019 | Haiberger | H01L 31/022408 |
| 2019/0015831 A1* | 1/2019 | Parry-Jones | B01L 3/502707 |
| 2019/0057955 A1* | 2/2019 | Moosburger | H01L 23/5383 |
| 2019/0089125 A1* | 3/2019 | Eichler | H01S 5/02469 |
| 2019/0309422 A1* | 10/2019 | Cooper | C09D 5/24 |
| 2019/0312082 A1* | 10/2019 | Schubert | H05B 33/145 |
| 2019/0392751 A1* | 12/2019 | Hsieh | H01L 25/0753 |
| 2020/0035748 A1* | 1/2020 | Xia | H01L 27/156 |
| 2020/0044126 A1* | 2/2020 | Tangring | H01L 33/486 |
| 2021/0074894 A1* | 3/2021 | Chong | H01L 33/44 |
| 2021/0278055 A1* | 9/2021 | Spinger | G02B 19/0014 |
| 2022/0085263 A1* | 3/2022 | Eberhard | H01L 33/40 |
| 2022/0123191 A1* | 4/2022 | Yamada | H01L 25/0753 |
| 2022/0140216 A1* | 5/2022 | Behringer | H01L 33/44 |
| | | | 257/79 |
| 2022/0231195 A1* | 7/2022 | Pickel | H01L 33/382 |
| 2022/0293667 A1* | 9/2022 | Lopez | H01L 27/156 |
| 2022/0293836 A1* | 9/2022 | Schwarz | H01L 25/0753 |
| 2023/0015476 A1* | 1/2023 | Rass | H01L 33/62 |
| 2023/0155061 A1* | 5/2023 | Tanaka | H01L 21/02543 |
| | | | 257/98 |
| 2023/0215979 A1* | 7/2023 | Kim | H01L 33/382 |
| | | | 257/495 |

FOREIGN PATENT DOCUMENTS

| | | |
|---|---|---|
| EP | 3093834 A1 | 11/2016 |
| KR | 1020120022256 A | 3/2012 |
| KR | 20120083663 A | 7/2012 |

OTHER PUBLICATIONS

DUPONT ME901, "Silver Conductive Adhesive for LED-Attach," DUPONT, 2014, p. 1-2.
DUPONT, "New Dimensions in Printed Electronics," Dupont Advanced Materials, Product Overview, Feb. 2018, pp. 1-2.
DUPONT 5056, "Bendable, White Reflector Paste," Technical Data Sheet; MCM5056, Oct. 2015, p. 1-2.
Wikipedia, "Galinstan," https://en.wikipedia.org/w/index.php?title=Galinstan&oldid=884341092; Feb. 21, 2019, pp. 1-4.
Wikipedia, "Surface tension," https://en.wikipedia.org/wiki/Surface_tension; Montag, pp. 1-24, Jun. 2019.

* cited by examiner

METHOD FOR PRODUCING OPTOELECTRONIC SEMICONDUCTOR DEVICES AND OPTOELECTRONIC SEMICONDUCTOR DEVICE

This patent application is a national phase filing under section 371 of PCT/EP2020/055889, filed Mar. 5, 2020, which claims the priority of German patent application 102019106546.1, filed Mar. 14, 2019, each of which is incorporated herein by reference in its entirety.

TECHNICAL FIELD

A method for producing optoelectronic semiconductor devices is specified. Furthermore, an optoelectronic semiconductor device is specified.

SUMMARY

Embodiments provide a method with which optoelectronic semiconductor chips can be efficiently electrically contacted.

According to at least one embodiment, the method is used for producing optoelectronic semiconductor devices. The finished semiconductor devices are, for example, light-emitting diodes, in short LEDs, preferably with a plurality of light-emitting units. For example, the finished semiconductor device is a display or display device. Furthermore, the finished semiconductor device may be a pixelated headlight, for example for selective illumination of individual regions, such as in a living room or on a stage, or in an adaptive front headlight in a motor vehicle.

According to at least one embodiment, the method comprises the step of providing one or more optoelectronic semiconductor chips. The at least one semiconductor chip is preferably a light emitting diode chip. Likewise, laser diode chips may be relied upon, for example vertical emitting lasers, in short VCSELs. If several semiconductor chips are provided, the semiconductor chips may be identical in construction to one another. Alternatively, different types of semiconductor chips may be incorporated.

Preferably, the at least one semiconductor chip is configured to generate visible light, such as blue light. Likewise, it is possible that semiconductor chips for generating green or yellow or orange or red light are present. Furthermore, semiconductor chips may be provided for generating near-ultraviolet radiation or near-infrared radiation. Radiation emitted from the semiconductor chip during operation may be generated directly in a semiconductor layer sequence of the semiconductor chip. Furthermore, it is possible that at least one luminescent substance is associated with the semiconductor chip, via which radiation generated in a semiconductor layer sequence can be partially or completely converted into radiation of a different wavelength. Furthermore, sensors such as photosensors or temperature sensors may be present.

According to at least one embodiment, the semiconductor chip comprises one or more contact sides. The at least one contact side is configured for energizing the semiconductor chip.

According to at least one embodiment, the method comprises the step of generating at least one coating region and at least one protection region on the contact side or on at least one of the contact sides or on several or all contact sides. The at least one coating region and the at least one protection region differ from each other, in particular with respect to their wetting properties for materials. For example, the coating region is designed to be hydrophobic and the protection region is hydrophilic or vice versa.

According to at least one embodiment, the method comprises the step of applying at least one liquid coating material to the at least one contact side. Preferably, the coating material is applied over an area, i.e., in particular without the aid of a masking material. In this case, no structuring of the coating material is achieved by applying the coating material per se. Alternatively, the coating material can be applied only locally, for example along regions in which conductor tracks are to be formed.

According to at least one embodiment, the at least one coating material comprises wetting properties with respect to the coating region. That is, the coating material wets the at least one coating region and covers it. Accordingly, the protection region has a non-wetting effect, so that the coating material ultimately leaves the protection region free.

In this case, the coating material is also applied to the protection region at least in places. This also preferably applies if the coating material is applied in a coarsely structured manner, for example in the manner of a conductor track. That is, the coating material preferably leaves the protection region again automatically. The withdrawal of the coating material from the protection region can still take place during the step of applying the coating material. Alternatively, the retraction occurs only when the coating material solidifies, for example due to a change in temperature.

According to at least one embodiment, the method comprises the step of solidifying the at least one coating material. The solidifying is, for example, a cooling and thus solidification, a hardening, for example thermal or photochemical, a drying, for example by evaporation of a solvent, and/or an alloy formation, for example by a reaction of the coating material with a component of the coating region, in particular accompanied by a melting point change. Prior to solidification, the coating material withdraws from the protection region due to the different wetting properties.

Thus, the solidification of the coating material on the at least one coating region creates the electrical contact structure. Preferably, the contact structure is located directly on the coating region. Thus, it is possible for the semiconductor chip to be energized through the at least one contact structure during intended use. That is, the contact structure forms a current-carrying component in the finished optoelectronic semiconductor device.

In at least one embodiment, the method is for producing optoelectronic semiconductor devices and comprises the following steps, in particular in the order indicated:

A) providing at least one optoelectronic semiconductor chip with at least one contact side, B) producing at least one coating region and at least one protection region on the contact side or on at least one of the contact sides, C) applying at least one liquid coating material to the at least one contact side in a planar or coarsely pre-structured manner, wherein the at least one coating material wets the at least one coating region and does not wet the at least one protection region, wherein the coating material is preferably applied both to the at least one coating region and to the at least one protection region and withdraws from the at least one protection region due to wetting properties, and D) solidifying the at least one coating material into at least one electrical contact structure on the at least one coating region, such that the semiconductor chip is energized through the at least one contact structure during intended use.

With the method described herein, fast and cost-effective electrical contacting of a plurality of semiconductor chips such as LED chips is possible. The term plurality means, for example, at least ten and/or at most $10^8$ semiconductor chips.

Common contacting methods such as wire bonding, creating planar conductor track connections or flip-chip soldering require the formation of structured electrical contact tracks or contact regions. In addition, precise placement of semiconductor chips is required. Such contacting processes represent a considerable effort, especially when a large number of semiconductor chips with small geometric dimensions need to be contacted.

In the method described here, LED chips can be contacted from above, for example, with a printable or sprayable or inkjetable or dipable or dewable or spin-on coating material, first in liquid and later in solid form with electrical conductors. For this purpose, the electrical conductors can be transparent or non-transparent or reflective. Transparent means, for example, a transmittance for the radiation emitted by the semiconductor chip of at least 50% or at least 80% or at least 90%. Reflective means in particular a reflectivity for the radiation emitted by the semiconductor chip of at least 50% or 80% or 90%.

In the case of non-transparent electrical conductors, particular care must be taken to ensure that the material for the conductors does not cover too much area of the semiconductor chip and thus does not shade an emission too much. For this purpose, a region can be provided on an LED chip and prepared by structuring on which the electrical conductors are to be connected. For this purpose, this region can be metallized, for example with a contact pad, in such a way that the electrical connection to the LED chip occurs with low loss and, on the other hand, there is enough surface area to attach the conductor to or on this location. This region can be located on a main side and/or side surfaces of the LED chip.

Furthermore, where no conductor is to be applied, the surface of the LED chip can be coated in such a way that the liquid of the coating material is repelled. For example, the surface in question can be made hydrophobic when a water-based coating material is used. This can be achieved, for example, by coating the relevant areas, which are later to be conductor-free, with an oxide such as silicon dioxide and subsequently etching them with hydrofluoric acid, for example, or else coating them with a hydrophobic material such as a perforated hydrocarbon, for example polytetrafluoroethylene.

In the case of transparent lines, the light-emitting diode chip can be structured and coated on the contact side before being placed on a later carrier, i.e. while still in the wafer assembly, in such a way that a good electrical connection to the semiconductor material is made at suitable points on the semiconductor chip. The material forming a connection to the conductor and thus to a carrier or to a current source on an outer side of the semiconductor chip is configured for connection to this conductor with a low electrical resistance. The corresponding areas may be electrically conductively connected to each other.

Even in the case of transparent conductors, regions on the semiconductor chip can be treated in such a way that these regions repel the coating material, as described in the case of a non-transparent, in particular metallic, conductor. Furthermore, additional materials with further functions can be added to a transparent conductor if required. For example, light-diffusing diffusers and/or luminescent substances can be admixed. Diffusors can, for example, produce an RGB pixel with particularly good color mixing when LED emitters for the colors red, green and blue are contacted together. Thus, two functions can be achieved cost-effectively in a single operation, namely the improvement of the optical properties and the electrical coupling.

Furthermore, a geometric shape in particular of a transparent conductor in connection with the refractive index can be used at the same time as an light extraction structure, also referred to as Lens-On-Chip. Hereby, an efficiency and/or a directionality, i.e. a radiation characteristic, can be influenced. With the application of the contact structure, an optical coating can be applied at the same time.

It is also possible to reshape steps in the semiconductor chip. Furthermore, side flanks of the semiconductor chip can be reshaped, depending on their topography. Further parameters such as surface tension, viscosity or glass point can be important for the coating material, which is initially to be applied in liquid form.

Thus, with the method described here, a cost-effective, parallelized contacting and wiring, assembly as well as coating of semiconductor chips such as LED chips can be achieved with low alignment requirements for the semiconductor chips and for the conductors for electrical contacting. The semiconductor chips can be mounted on a carrier or on a substrate and efficiently provided with the coating material for electrical contacting from a side facing away from the carrier or substrate.

According to at least one embodiment, the at least one coating region and/or the at least one protection region are each an integral part of the finished semiconductor device. That is, the coating region and/or the protection region are not merely temporary components such as photoresists or mask layers. That is, the coating region and the protection region are detectable in the finished semiconductor device, preferably as are the measures whereby the differences between the coating region and the protection region are achieved.

According to at least one embodiment, the at least one semiconductor chip comprises an average edge length of at most 0.2 mm or 0.1 mm or 50 µm, viewed in top view onto the at least one contact side. Preferably, the average edge length of the semiconductor chip is at most 30 µm or 15 µm or 10 µm. Alternatively or additionally, the average edge length of the semiconductor chip is at least 1 µm or 2 µm or 5 µm. In other words, the semiconductor chip is comparatively small. The mean edge length is in particular the sum of all edge lengths taken together, divided by the number of edges, as seen in top view onto the contact side.

According to at least one embodiment, the coating region or is at least one of the coating regions or are all coating regions formed by a smooth semiconductor surface region of the semiconductor chip. Smooth means in particular a roughness of at most 3 nm or 2 nm or 1 nm. In the present context, roughness is understood to mean in particular fourth-order shape deviations, i.e. roughness in the form of grooves, scales and crests, see DIN 4760.

According to at least one embodiment, the protection region or at least one of the protection regions or all protection regions are formed by a rough semiconductor surface region of the semiconductor chip. Instead of a semiconductor surface region, a passivation layer such as an oxide layer can also be used in the protection region.

A roughness of the corresponding surface region for the protection region is preferably at least 5 nm or 10 nm or 20 nm. Alternatively or additionally, this surface roughness is at most 150 nm or 100 nm or 50 nm or 30 nm. In particular, this roughness for the area of the protection region is significantly smaller than a usual roughening for improving a light extraction efficiency.

Due to this surface roughness, the so-called lotus effect is achieved. That is, in the direction parallel to a main expansion direction of the surface, surface structures comprise a periodicity that is significantly smaller than a drop diameter of the coating material. Significantly smaller means, for example, at least a factor of 5 or 10 or 30.

According to at least one embodiment, the at least one coating region and/or the at least one protection region or at least some of the coating regions and/or at least some of the protection regions are still created in a wafer assembly. That is, the creation of the coating regions and/or the protection regions can take place before the semiconductor chips are released from the wafer assembly. A plurality of the semiconductor chips is present in the wafer assembly, and preferably at a distance from one another as originally grown. In this case, the semiconductor chips can still be located on a growth substrate or on a replacement carrier, wherein in the latter case a relative position of the semiconductor chips with respect to each other is not or not significantly changed compared to the growth.

According to at least one embodiment, the coating region or at least one of the coating regions or are all coating regions formed by a metallization. The metallization preferably directly contacts a semiconductor surface region for the coating region. A thickness of this metallization is, for example, at least 5 nm or 10 nm or 20 nm and/or at most 2 µm or 1 µm or 0.3 µm.

According to at least one embodiment, the protection region or is one of the protection regions or all of the protection regions are formed by one or by several protective coatings. The protective coating may comprise a smooth surface or may be provided with the surface roughness. For example, the at least one protective coating comprises a fluorinated or a perfluorinated plastic such as polytetrafluoroethylene. Alternatively, the at least one protective coating comprises an oxide such as silicon dioxide or such as aluminum oxide. The protective coating may consist of one or more of these materials.

According to at least one embodiment, the coating material is applied in step C) in a mask-free, large-area and/or unstructured manner. In this process, the coating material is preferably applied simultaneously and contiguously over a large number of semiconductor chips. The number of semiconductor chips over which the coating material is applied is preferably at least $10^3$ or $10^5$ or $10^7$ or $10^8$. Alternatively or additionally, this number is at most $10^{10}$ or $10^9$ or $10^8$.

According to at least one embodiment, the coating material or at least one of the coating materials is applied in step C) by means of spraying, printing, spin-on or dewing. Printing includes, for example, screen printing processes or inkjet printing processes, with which coarse structuring is optionally possible.

When dewing, the semiconductor chips are at a comparatively low temperature, relative to an evaporation temperature of the coating material or a solvent of the coating material. That is, the coating material can condense from a gas phase on the semiconductor chips and is effectively thus deposited as a liquid.

According to at least one embodiment, in step C), the coating material or at least one of the coating materials is applied by dipping. That is, the semiconductor chips, for example, applied to a carrier, still on the growth wafer or on a temporary substrate, may be predominantly or completely brought in the liquid coating material. After dipping or upon dipping, the coating material preferably withdraws to the coating regions.

According to at least one embodiment, the finished contact structure or at least one of the finished contact structures or all of the finished contact structures is metallic. For example, the contact structures are made of one or more metals or one or more metal alloys and/or metal layers, for example, the contact structure or are the contact structures made of one or more of the following metals: Al, Cu, Zn, Ni, Ag, Au, Pt, Ti, In, Cr, Mo, W, Fe, Mn, Cu, Ge, Si. In this context, the semiconductor materials Ge and Si are considered as metals. Furthermore, Hg can be used as metal for the contact structures.

According to at least one embodiment, the coating material or at least one of the coating materials is a solder. That is, the coating material may be metallic and applied in liquid form. It is possible that the solder does not or does not significantly change its chemical composition during solidification.

Also, the coating material may be metallic and change its chemical composition during solidification. For example, mercury, Hg for short, or Galinstan is then used as the coating material. Mercury can be applied as a liquid at room temperature or forms a liquid when vaporized. By using Hg, amalgams can be created specifically at the at least one coating region, alone or in combination with another coating material in addition to Hg or to an Hg-containing compound. Galinstan is an in particular eutectic alloy of Ga, indium and preferably also of Sn. The alloy of 68% to 69% Ga, 21% to 22% In and 9.5% to 10.5% Sn comprises a particularly low melting point of approximately −19.5° C.

Compared with water, with a surface tension of about 70 mN/m at room temperature, Hg has a very high surface tension of about 470 mN/m and Galinstan of about 720 mN/m at room temperature. In contrast, the surface tension of solvents such as n-hexane or acetone is around 20 mN/m at room temperature.

According to at least one embodiment, a further contact structure is produced on the contact side. For example, the contact structure is designed as a cathode and the further contact structure is designed as an anode, or vice versa. The contact structure and the further contact structure are preferably not electrically short-circuited. It is possible that the only electrical connection between the contact structure and the further contact structure within the semiconductor device is via the semiconductor chip.

According to at least one embodiment, the contact structure and the further contact structure comprise different heights at the contact side. That is, the semiconductor chip may be thicker in the region of the contact structure than in the region of the further contact structure or vice versa.

According to at least one embodiment, the semiconductor chip comprises one or more steps between the contact structure and the further contact structure. Such a step may extend across an active zone of the semiconductor chip.

According to at least one embodiment, the further contact structure is generated in a further step C) and in a further step D). That is, both the contact structure and the further contact structure may be generated from a liquid phase. Thus, both an anode-side and a cathode-side contacting of the at least one semiconductor chip is possible from one or more liquid phases. In the present context, liquid phase is also understood to mean deposition from a gas phase, wherein a liquid is formed from the gas phase, for example via condensation.

According to at least one embodiment, the contact structures or at least one of the contact structures or all contact structures and/or the at least one further contact structure each form electrical contact regions for external electrical contacting of the finished semiconductor device. In this case, it is possible that the contact structure and/or the further contact structure is in direct contact with a semiconductor layer sequence of the semiconductor chip concerned. For example, the contact structure is then made of Galinstan.

According to at least one embodiment, the finished semiconductor device comprises a carrier. The carrier is, for example, a printed wiring board such as a printed circuit board, PCB for short.

According to at least one embodiment, one or more semiconductor chips are mounted on the carrier in step A). For this purpose, the carrier may comprise electrical contact regions, for example a common anode or a common cathode, or a separately electrically controllable electrical contact region for each semiconductor chip. If the carrier comprises a plurality of separately controllable contact regions, the carrier may be a silicon substrate comprising electronic components such as transistors and/or switches for selectively controlling and addressing individual semiconductor chips.

According to at least one embodiment, the contact structure or at least one of the contact structures is or all electrical contact structures are electrical conductor tracks. That is, via the at least one contact structure a conductor structure such as a conductor track can be formed from the semiconductor chip concerned to an electrical contact point of the carrier. The associated electrical contact point of the carrier, to which the contact structure in the form of a conductor track extends, is preferably located beside the semiconductor chip concerned, in particular outside a field of a plurality of the semiconductor chips, as seen in a top view onto the contact side.

According to at least one embodiment, the contact structure or at least one of the contact structures forms an electrically conductive mesh. Thus, a single contact structure can electrically connect a plurality of the semiconductor chips with a common contact point, in particular on the carrier.

According to at least one embodiment, the contact structure or at least one of the contact structures forms a contact frame. The contact frame preferably surrounds the contact side all around at an edge. Thus, a light exit window can be formed centrally in the contact side, which is surrounded and/or framed all around by the contact structure.

According to at least one embodiment, the contact structure or at least one of the contact structures comprises one or more optically effective admixtures. In particular, the at least one admixture is selected from the group consisting of: a luminescent substance, a diffuser, a dye, a filter substance, a thermal conductive substance, a substance for refractive index adjustment, a substance for adjustment of a coefficient of thermal expansion.

According to at least one embodiment, the contact structure or at least one of the contact structures is formed by a translucent material. For example, the contact structure is then made of a transparent conductive oxide, in short TCO, such as ITO or ZnO.

Metallic light-transmissive contact structures are also possible. In this case, a thickness of the at least one contact structure in question is preferably at most 20 nm or 10 nm or 5 nm.

According to at least one embodiment, the contact structure is designed as an optical element. For example, the contact structure may be shaped as a lens, such as a converging lens or a diverging lens.

According to at least one embodiment, the semiconductor chip comprises an optics body. The optics body may be a luminescent substance. Furthermore, it is possible that the optics body is formed by a light-transmissive growth substrate for a semiconductor layer sequence of the semiconductor chip.

Furthermore, an optoelectronic semiconductor device is specified. In particular, the semiconductor device is fabricated with a method as described in connection with one or more of the above embodiments. Features of the semiconductor device are therefore also disclosed for the method, and vice versa.

In at least one embodiment, the optoelectronic semiconductor device comprises an optoelectronic semiconductor chip with a contact side. A coating region and a protection region are provided on the contact side. An electrical contact structure is provided on the coating region, so that the protection region is free from the contact structure. The contact structure can extend meniscus-shaped at an edge of the coating region toward the protection region. That is, at least toward the protection region, the contact structure may be shaped like a drop resting on a base. The contact structure preferably does not touch the protection region, but due to the meniscus-shaped design it can cover the protection region in places when viewed in top view onto the contact side.

BRIEF DESCRIPTION OF THE DRAWINGS

In the following, a method described herein and an optoelectronic semiconductor device described herein are explained in more detail with reference to the drawing by means of exemplary embodiments. Like reference signs thereby specify like elements in the individual figures. However, no references to scale are shown, rather individual elements may be shown exaggeratedly large for better understanding.

FIGS. 1 to 12 show schematic representations of method steps of a method described herein, wherein FIGS. 1, 5, 7, 9 and 11 show schematic top views and FIGS. 2, 3, 4, 6, 8, 10 and 12 show schematic sectional views;

DETAILED DESCRIPTION OF ILLUSTRATIVE EMBODIMENTS

Figure 1:
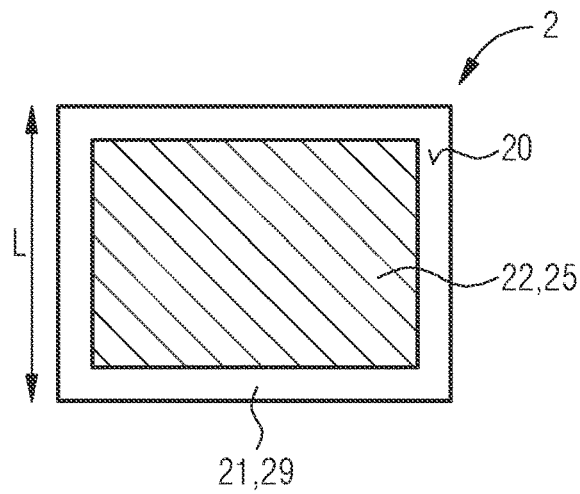

FIGS. 1 to 12 illustrate an exemplary embodiment of a method for producing optoelectronic semiconductor devices 1. In the top view of FIG. 1, an optoelectronic semiconductor chip 2 for the method is shown. The semiconductor chip 2 is preferably a light-emitting diode chip, or LED chip for short. An edge length L of the semiconductor chip 2 is in the region of around 10 µm as viewed from above onto a contact side 20. The semiconductor chip 2 is thus comparatively small and can be a µLED.

The contact side 20 comprises a centrally located protection region 22 and a frame-shaped coating region 21 surrounding the contact side 20 at an edge. A contact frame 29 is thus formed by the coating region 21. The protection region 22 represents a light exit window 25 of the semiconductor chip 2. In operation, the semiconductor chip 2 preferably emits a predominant portion of its radiation, for example at least 70% or at least 90%, at the light exit window 25.

Figure 2:
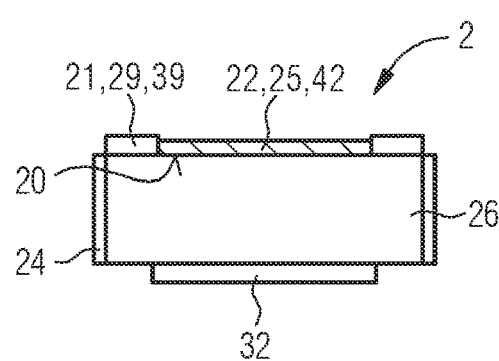
Figure 3:
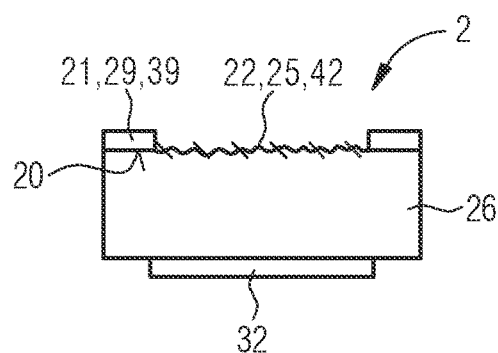
Figure 4:
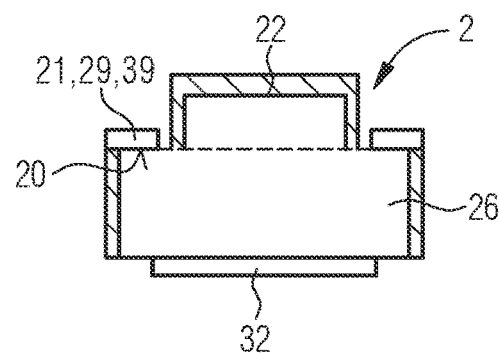

FIGS. 2 to 4 show schematic sectional views for possible realizations of the semiconductor chip 2 as shown in the top view in FIG. 1. In the following exemplary embodiments, all variants of the semiconductor chip 2 as illustrated in connection with FIGS. 2 to 4 may be referred to, even if the exemplary embodiments are each explicitly illustrated for only one of these designs.

In the semiconductor chip 2 of FIG. 2, the contact side 20 in the protection region 22 is provided with a protective coating 42. The protective coating 42 covers the entire protection region 22. Side surfaces of the semiconductor chip 2 may also optionally be covered by a passivation layer 24. Alternatively to such a passivation layer 24, the protective coating 42 may be extended to the side surfaces. The protective coating 42 or the passivation layer 24 may extend to another electrical contact structure 32 on an underside of the semiconductor chip 2, other than as illustrated in FIG. 2.

The protective coating 42 is preferably comparatively thin. In particular, a thickness of the protective coating 42 is at most 200 nm or 100 nm or 50 nm or 20 nm. The protective coating 42 may be smooth. Preferably, the protective coating 42 is made of a perfluorinated plastic or an oxide such as silicon dioxide.

These explanations regarding the protective coating 42 as well as the passivation layer 24 to FIG. 2 apply accordingly to all other exemplary embodiments.

A metallization 39 is optionally present in the coating region 21. The metallization 39 may be applied directly to a semiconductor material of the semiconductor chip 2. Preferably, the optional metallization 39 is also comparatively thin. The metallization 39 may completely cover the coating region 21.

According to FIG. 3, the hatched symbolized protection region 22 is formed by a roughening 41. The roughening 41 can achieve a kind of lotus effect, so that a liquid beads off the roughening 41 and collects in the coating region 21. For this purpose, the roughening 41 preferably comprises a small average roughness of, in particular, a few 10 nm.

FIG. 3 shows that the roughening 41 can be generated directly from a semiconductor material of the semiconductor chip 2. Deviating from this, the roughening 41 can also be generated in a protective coating, not drawn in FIG. 3. That is, the protective coating in which the roughening 41 is produced is then located directly on the semiconductor material.

Such a roughening 41 is produced, for example, by depositing a silicon dioxide layer which is etched with hydrofluoric acid, HF for short, in order to achieve a lotus effect on a surface. The detection of such a structuring is possible, for example, by means of atomic force microscopy or electron microscopy.

In FIGS. 2 and 3, the coating region 21 and the protection region 22 lie approximately in a common plane. In contrast, FIG. 4 shows that a predominant part of the protection region 22 may rise above a plane defined by the coating region 21. Side surfaces of a semiconductor layer sequence 26 of the semiconductor chip 2 as well as the elevation may be provided with a roughening, a protective coating and/or a passivation layer to ensure non-wetting properties with respect to a coating material not drawn.

An optics body 6 may be attached to the semiconductor layer sequence 26. The optics body 6 is transmissive to radiation generated during operation of the semiconductor chip 2. Differing from the illustration in FIG. 4, the optics body may be lens-shaped. The optics body 6 may be a separately fabricated body deposited on the semiconductor layer sequence 26, wherein a bonding agent layer may be present. Further, the optics body 6 may be formed by a growth substrate for the semiconductor layer sequence.

As an alternative to a separate optics body, the elevation with the protection region 22 may form part of the semiconductor layer sequence 26 of the semiconductor chip 2. For example, an n-type semiconductor sub-layer of the semiconductor layer sequence 26 is etched back all around so as to form the contact frame 29. Optionally, the semiconductor layer sequence 26 is provided with the metallization 39 around the elevation with the protection region 22.

Figure 5:
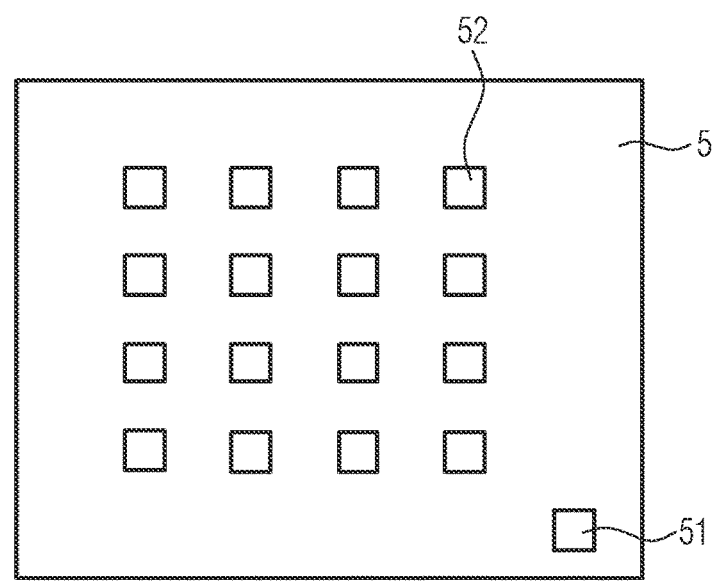
Figure 6:
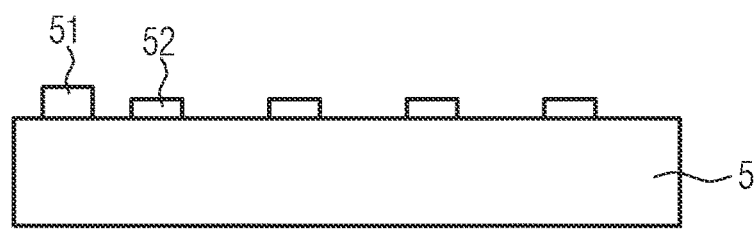

In the method step of FIG. 5, a carrier 5 is provided. The carrier 5 is, for example, a printed circuit board or a silicon carrier with integrated electronics. The carrier 5 comprises further electrical contact points 52 which are later individually assigned to the semiconductor chips 2. In addition, an electrical contact point 51 is provided, for example as a common anode or as a common cathode. The contact points 51, 52 may be located in a common plane on the carrier 5. An associated side view is shown in FIG. 6.

Figure 7:
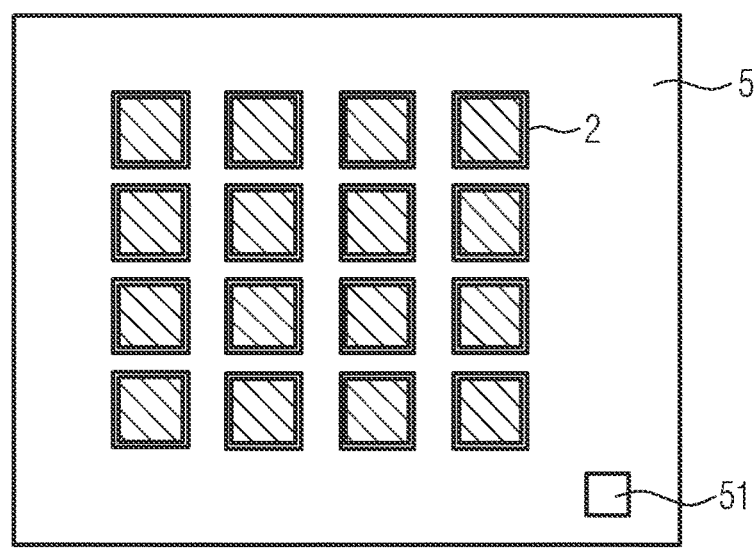
Figure 8:
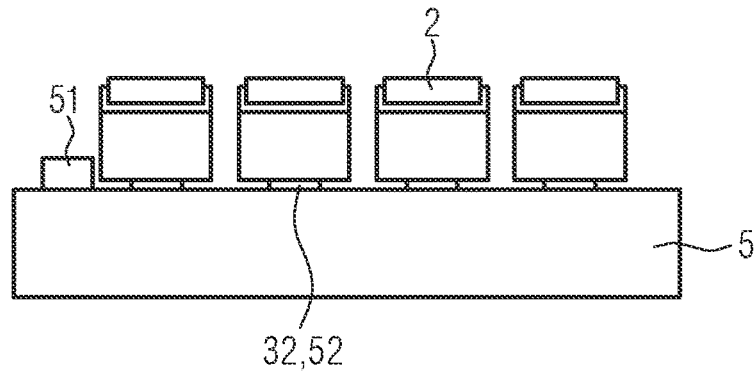

In the method step of FIGS. 7 and 8, the semiconductor chips 2 are applied to the further contact points 52. The application of the semiconductor chips 2 can be performed from a wafer assembly in which the semiconductor chips 2 are grown. An area density of the semiconductor chips 2 may decrease from a wafer, not drawn, towards the carrier 5, for example, by at least a factor of 10 and/or by at most a factor of 1000, for example, by approximately a factor of 100. That is, the semiconductor chips 2 comprise a significant distance from each other on the carrier 5, but are still arranged comparatively densely, for example, with an area fraction of at least 0.5% or 1% or 5% and/or of at most 60% or 30% or 10%.

Figure 9:
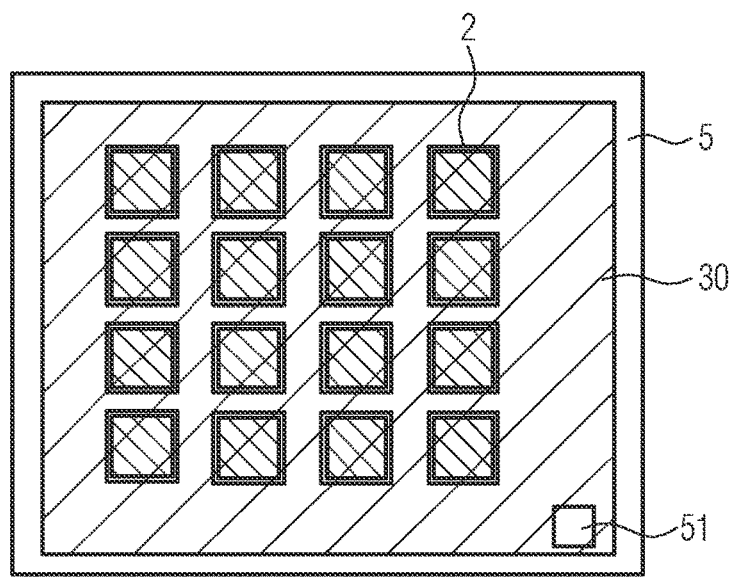
Figure 10:
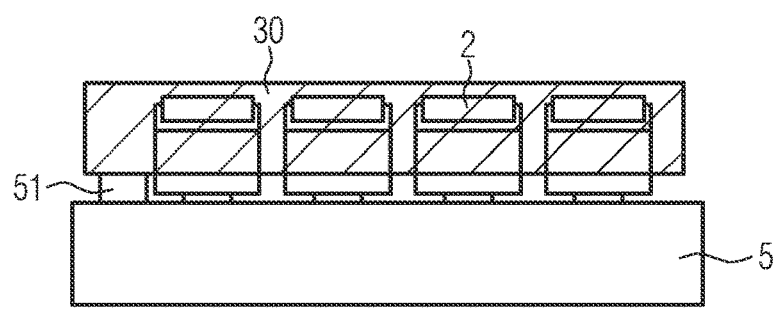

In the method step of FIGS. 9 and 10, it is shown that a coating material 30 is applied in an areal and initially unstructured manner. The coating material 30 is, for example, a liquid solder or an electrically conductive ink with silver particles. In addition, an aqueous solution with a zinc salt may be relied upon so that a reduction to zinc is possible. Similarly, coating materials 30 containing aluminum hydroxide are possible. In the case of non-metallic coating materials 30, for example, flocculation of zinc oxide from an aqueous phase may occur.

Figure 11:
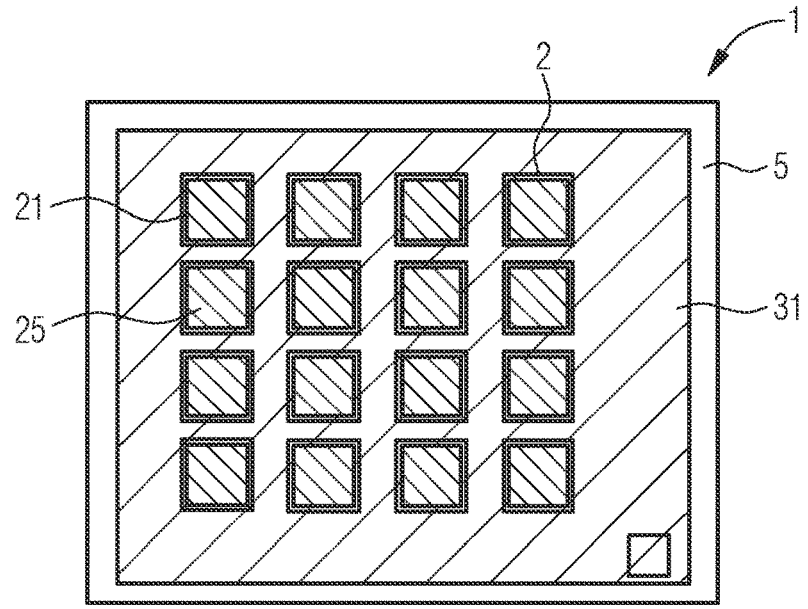
Figure 12:
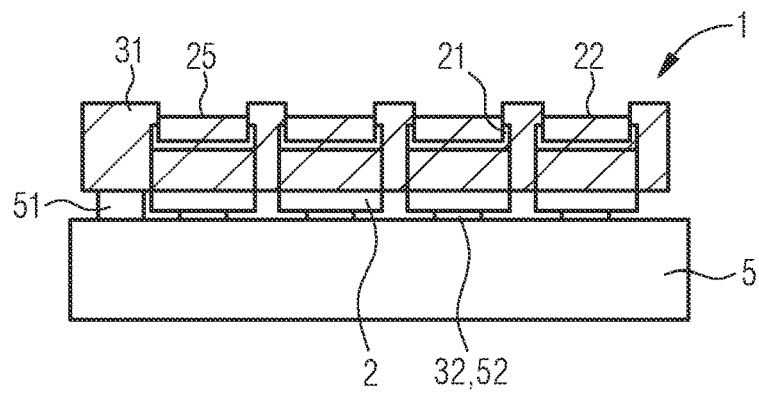

In the method steps of FIGS. 11 and 12, it is illustrated that due to the protection regions 22 having an anti-wetting effect, the coating material has withdrawn onto the coating regions 21. Thus, the light exit windows 25 are freed from the coating material 30. Thus, the coating material 30 on the semiconductor chips 2 preferably wets only the coating regions 21.

Deviating from the illustration in FIGS. 11 and 12, it is possible for the coating material 30 to be in direct contact with the carrier 5 over an area. In this case, however, electrical short circuits to the other contact points 52 must be avoided. Preferably, however, the carrier 5 also has an antiwetting effect on the coating material 30.

Thus, an electrical contact structure 31 is created from the coating material 30, which is adapted in the form of a grid and electrically conductively connects the coating regions 21 with the contact point 51 on the carrier 5.

Figure 13:
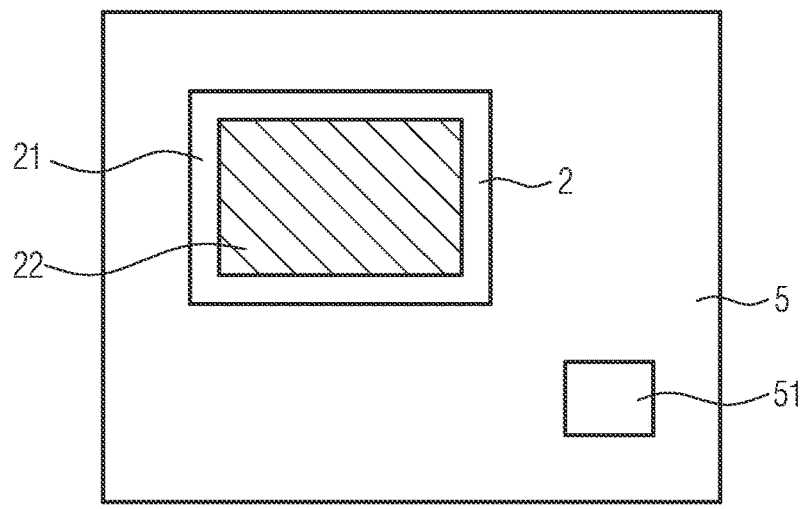
FIGS. 13 to 15 show schematic top views of method steps of an exemplary embodiment of a method described herein.
Figure 14:
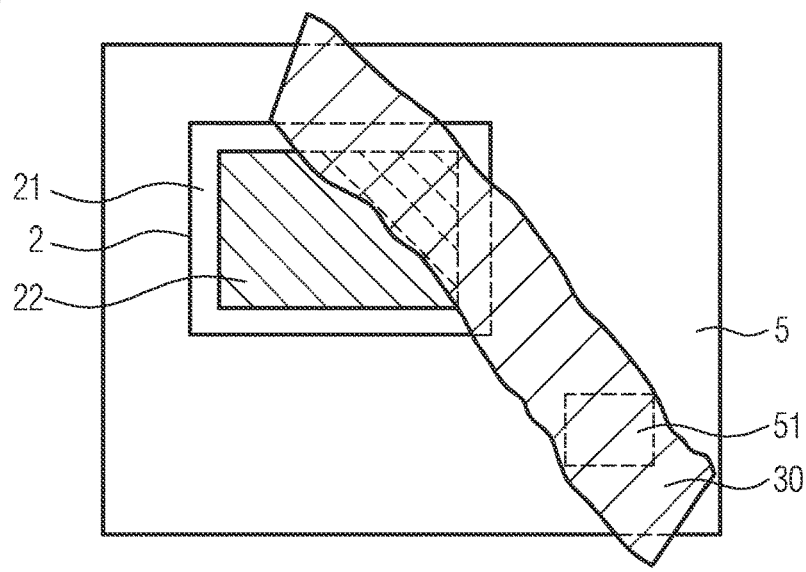
Figure 15:
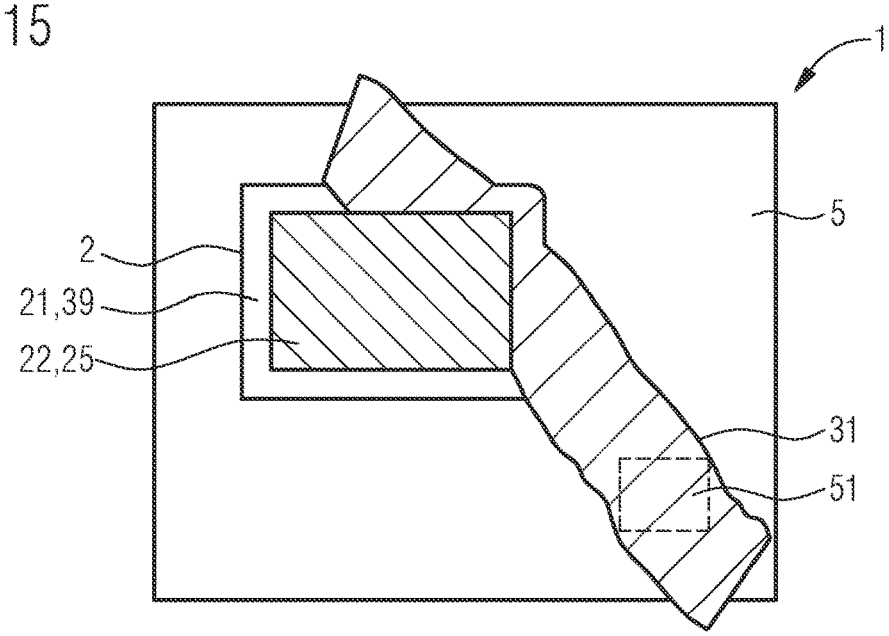
Figure 16:
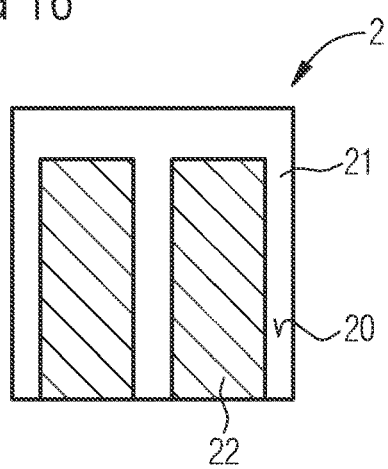
FIGS. 16 to 19 show schematic top views of semiconductor chips for exemplary embodiments of methods described herein.

FIGS. 13 to 15 illustrate a further exemplary method. According to FIG. 13, the semiconductor chip 2 is attached to the carrier 5. To simplify the illustration, only one of the semiconductor chips 2 is shown, but many semiconductor chips 2 may be attached.

In the step shown in FIG. 14, the coating material 30 is attached in a conductor track-like manner and in a rough pre-structured manner. Thereby, the coating material 30 can be applied similar to a conductor track first over the semiconductor chip 2 and in particular over the protection region 22, for example with a printing process.

In FIG. 15, it can be seen that the coating material has withdrawn from the light exit window 25 of the protection region 22 and is confined to the coating region 21 on the semiconductor chip 2. Thus, an electrical connection between the contact point 51 and the coating region 21 can be efficiently formed without the need to generate the final shape of the contact structure 21 immediately when the coating material 30 is applied. As in all other exemplary embodiments, the coating region 21 may optionally be provided with the metallization 39.

FIGS. 16 to 19 illustrate several exemplary embodiments for the design of the contact side 20 for semiconductor chips 2 usable herein.

In deviation from the exemplary embodiments of FIGS. 1 to 15, the coating region 21 in FIG. 2 is not attached in the shape of a frame, but extends in an E-shape over the contact side 20. Thus, two separate protection regions 22 can be formed on the contact side 20.

Figure 17:
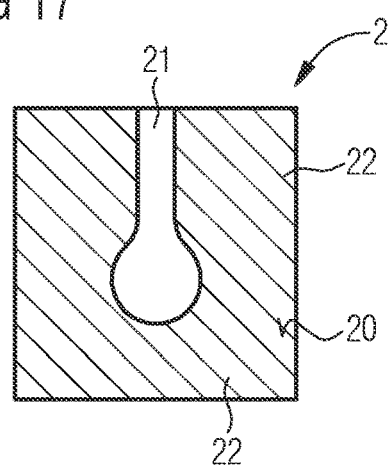

According to FIG. 17, the coating region 21 comprises, in a center of the contact side 20, a comparatively large round region formed as an extension of a strip extending to an edge of the contact side 20. Thus, a large-area electrical contact can be realized in a center of the contact side 20.

Figure 18:
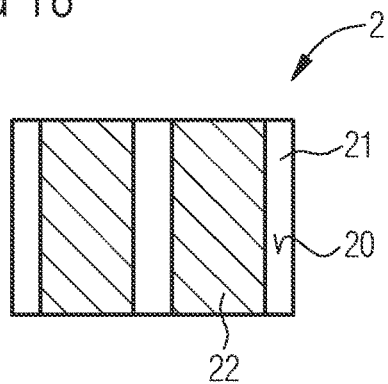

In FIG. 18, there are several separate coating regions 21, each of which is strip-shaped and separated from one another by protection regions 22.

Figure 19:
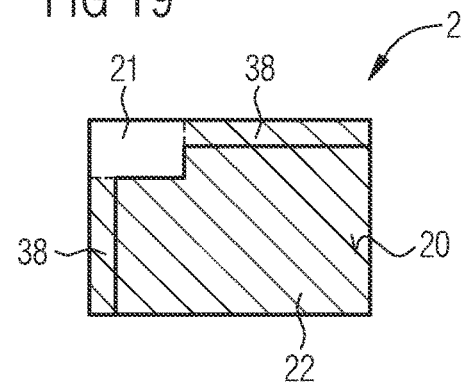

In the exemplary embodiment of FIG. 19, the coating region 21 is limited to a corner region of the contact side 20. Extending from the coating region 21 are optional contact extensions 38, which are formed by further metallizations, for example. The contact extensions 38 may be configured such that there is no wetting with the coating material 30. That is, the protection region 22 may extend to the contact extensions 38.

The designs of the contact side 20 of FIGS. 16 to 19 are to be understood as merely exemplary. Other geometries of the coating regions 21 and the protection regions 22 are also possible.

Figure 20:
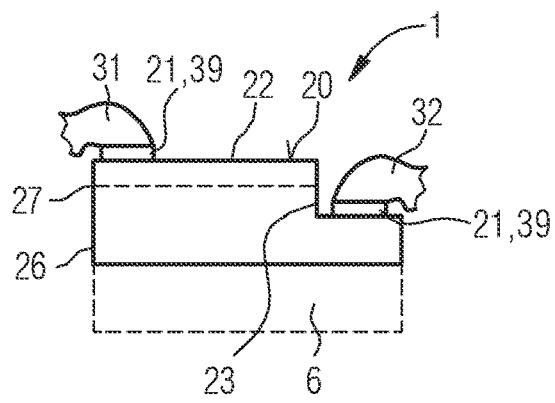
FIGS. 20 and 21 show schematic sectional views of exemplary embodiments of optoelectronic semiconductor devices described herein.

In FIG. 20, it is illustrated that the semiconductor layer sequence 26 of the semiconductor chip 2 comprises an active zone 27 for light generation. A step 23 is formed across the active zone 27 so that the coating regions 21 for the contact structures 31, 32 are at different heights. Metallizations 39 may be present in each case.

The coating regions 21 are the origin of the contact structures 31, 32, each of which can be deposited from a liquid phase. The contact structures 31, 32 can be generated in separate steps so that electrical short circuits can be avoided. Optionally, the optics body 6, for example a growth substrate, is still located on the semiconductor layer sequence 26.

The semiconductor layer sequence is preferably based on a III-V compound semiconductor material. The semiconductor material is, for example, a nitride compound semiconductor material such as AlnIn1-n-mGamN or a phosphide compound semiconductor material such as AlnIn1-n-mGamP or also an arsenide compound semiconductor material such as AlnIn1-n-mGamAs or such as AlnGamIn1-n-mAskP1-k, wherein in each case $0 \leq n \leq 1$, $0 \leq m \leq 1$ and $n+m \leq 1$ as well as $0 \leq k < 1$. Preferably, for at least one layer or for all layers of the semiconductor layer sequence, $0 < n \leq 0.8$, $0.4 \leq m < 1$ and $n+m \leq 0.95$ as well as $0 < k \leq 0.5$. In this context, the semiconductor layer sequence may comprise dopants as well as additional constituents. However, for simplicity, only the essential constituents of the crystal lattice of the semiconductor layer sequence, i.e., Al, As, Ga, In, N, or P, are specified, even though these may be partially replaced and/or supplemented by small amounts of additional substances.

For example, the contact structure 31 is generated as explained in connection with FIGS. 1 to 12. For the further contact structure 32, the same method or also a different method can be used.

In a variant of the production method for one of the contact structures, the semiconductor chip 2 comprises, at one or both of the coating regions 21, the metallization 39 which is of a metal which forms an amalgam with Hg and/or which can react with Galinstan. For example, the corresponding metallization 39 is of Al, Cu, Zn, Ni, Ag, Au, Pt, Ti and/or In. The other metallization 39, present for example for the contact point 31, is of another metal which does not form an amalgam with Hg. This other metallization 39 is for example of Cr, Mo, W, Fe, Mn, Co, Ge and/or Si.

If the semiconductor chip 2 is now placed on a carrier and vapor-deposited with Hg over its surface or immersed in Hg, the Hg forms an amalgam with the metallizations 39 for a type of contact points 32 and removes without reaction from the differently formed metallization. Thus, an electrical interconnection with a specific polarity can be created in a targeted manner without alignment effort, even for many and small contact structures 31, 32.

Alternatively, an aqueous HgCl2 solution can be used to apply Hg, wherein no noble metals such as Au or Pt should then be used.

A corresponding production method, based on Hg, can also be used in all exemplary embodiments.

Figure 21:
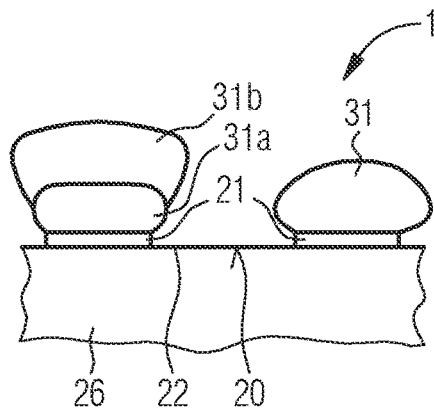

In FIG. 21, left side, it is illustrated that multiple contact structures 31a, 31b can be deposited stacked on top of each other. A coating material for a contact structure 31b generated as a second one preferably only wets a material of a previously generated contact structure 31a. In the direction away from the contact side 20, the contact structures 31a, 31b can widen. The protection region 22 can therefore be partially covered by the contact structures 31a, 31b when viewed from above onto the contact side 20.

In FIG. 21, right side, it is illustrated that the contact structure 31 may be made of a translucent material, for example a TCO. In this case, it is possible that the contact structure 31 is lens-shaped and serves as an optical element.

Furthermore, it is illustrated in FIG. 21 that the contact structures 31, 31a, 31b may each be meniscus-shaped at an edge of the coating regions 21. Thus, a shape of the contact structures 31, 31a, 31b when viewed at the edge in cross-section is similar to a droplet resting on a liquid-repellent material.

Figure 22:
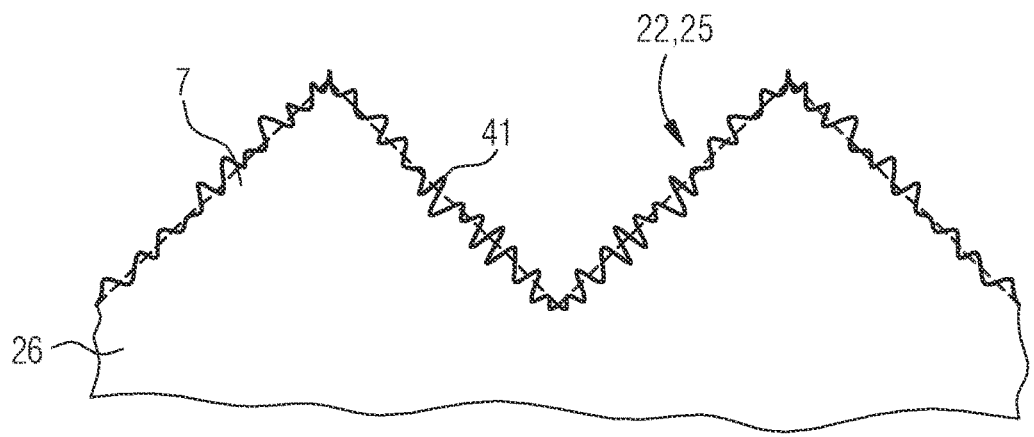
FIG. 22 shows a schematic sectional view of a semiconductor layer sequence for exemplary embodiments of optoelectronic semiconductor devices described herein.

In FIG. 22 an exemplary embodiment of a semiconductor layer sequence 26 provided with light extraction structures 7 is shown. The light extraction structures 7 comprise, for example, an average structure size in the region of 0.5 µm to 5 µm. Thus, the light extraction structures 7 are considerably larger than structures of the roughening 41 used for the lotus effect of the protection region 22.

Figure 23:
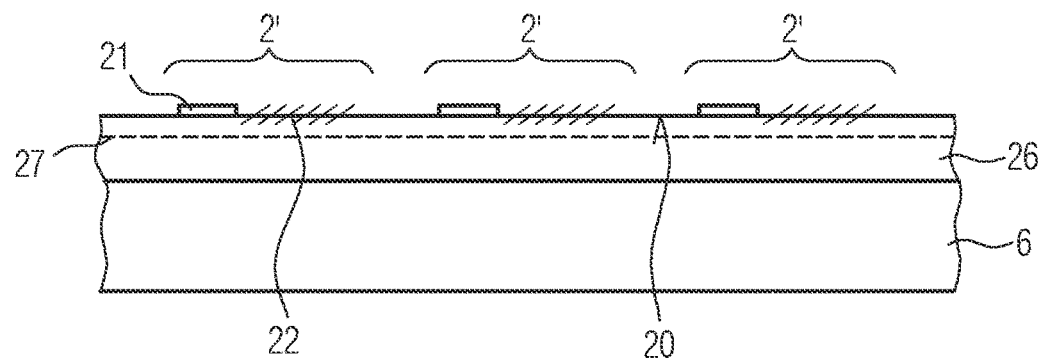
FIGS. 23 and 24 show schematic sectional views of method steps of an exemplary embodiment of a method described herein.

FIG. 23 illustrates that the coating regions 21 and the protection regions 22, symbolized by a hatching, can still be generated in a wafer assembly. Here, the semiconductor layer sequence 26 with regions 2' for the semiconductor chips 2 is still on the growth substrate 6. The active zone 27 is grown continuously and parallel to a main side of the growth substrate 6.

Figure 24:
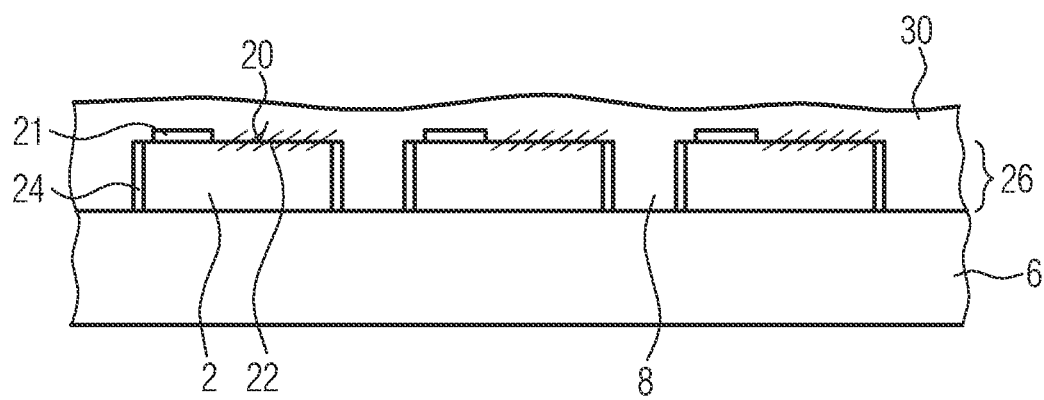

According to FIG. 24, the coating material 30 for creating the contact structures not drawn is also still applied in the wafer assembly, only drawn in simplified form in FIG. 24. In this process, mesa trenches 8 are preferably already formed, so that the semiconductor chips 2 are present separately, but are still located on the growth substrate 6. Side surfaces of the semiconductor chips 2 can be provided with the passivation layer 24, in particular in the region of the mesa trenches 8. It is possible that electrical contact regions are formed directly on the semiconductor layer sequence 26 by means of the coating material 30.

Deviating from FIGS. 23 and 24, it is possible that the coating regions 21 and the protection regions 22 are formed only after the mesa trenches 8 have been generated. Further, although less preferred, the coating material 30 may be applied before the mesa trenches 8 are created.

The invention described herein is not limited by the description based on the exemplary embodiments. Rather, the invention encompasses any new feature as well as any combination of features, which in particular includes any combination of features in the patent claims, even if that feature or combination itself is not explicitly specified in the patent claims or exemplary embodiments.

The invention claimed is:

1. A method for producing optoelectronic semiconductor devices, the method comprising:
   providing at least one optoelectronic semiconductor chip with at least one contact side on a carrier, wherein the optoelectronic semiconductor chip is mounted to the carrier, and wherein the carrier comprises an electrical contact point adjacent to the optoelectronic semiconductor chip as viewed in a top view onto the at least one contact side;
   generating at least one coating region and at least one protection region on the at least one contact side;
   applying at least one liquid coating material to the at least one contact side, wherein the at least one liquid coating material wets the at least one coating region and does not wet the at least one protection region; and
   solidifying the at least one liquid coating material into at least one electrical contact structure, wherein the at least one electrical contact structure directly adjoins the at least one coating region and extends from the at least one coating region to the electrical contact point.

2. The method according to claim 1,
   wherein the at least one coating region and the at least one protection region are each an integral part of a finished semiconductor device,
   wherein the at least one liquid coating material is applied to both the at least one coating region and the at least one protection region and withdraws from the at least one protection region due to wetting properties,
   wherein the at least one optoelectronic semiconductor chip is a light emitting diode chip or a laser diode chip, and
   wherein the at least one optoelectronic semiconductor chip comprises an average edge length of at most 0.1 mm as seen in the top view onto the at least one contact side.

3. The method according to claim 1,
   wherein the at least one coating region is formed by a smooth semiconductor surface region or by a metallization of the at least one optoelectronic semiconductor chip and the at least one protection region is formed by a rough semiconductor surface region or by a rough protective coating of the at least one optoelectronic semiconductor chip, and
   wherein a roughness of the rough protection region is between 5 nm and 100 nm inclusive.

4. The method according to claim 1,
   wherein the at least one coating region is formed by a semiconductor surface region or by a metallization of the at least one optoelectronic semiconductor chip and the at least one protection region is formed by at least one protective coating, and
   wherein the protective coating is smooth and comprises a perfluorinated plastic or an oxide.

5. The method according to claim 1,
   wherein the at least one coating region and the at least one protection region are produced in a wafer assembly, and
   wherein, in the wafer assembly, a plurality of optoelectronic semiconductor chips are present at a distance from each other as originally grown.

6. The method according to claim 1, wherein applying the at least one liquid coating material comprises applying the at least one liquid coating material mask-free to at least $10^5$ optoelectronic semiconductor chips to at most $10^{10}$ optoelectronic semiconductor chips simultaneously.

7. The method according to claim 1, wherein applying the at least one liquid coating material comprises applying the at least one liquid coating material by spraying, printing, spin-on or dewing.

8. The method according to claim 1, wherein applying the at least one liquid coating material comprises applying the at least one liquid coating material by dipping.

9. The method according to claim 1, wherein the at least one electrical contact structure is metallic and opaque.

10. The method according to claim 9, wherein the at least one liquid coating material is a solder.

11. The method according to claim 1, wherein a further contact structure is formed on the at least one contact side in addition to the at least one electrical contact structure, and wherein the at least one contact side comprises different heights in a region of the at least one electrical contact structure and in a region of the further contact structure so that at least one step is present between these regions.

12. The method according to claim 11, wherein the further contact structure is formed by:
    applying at least one further liquid coating material to the at least one contact side, wherein the at least one further coating material wets a further coating region and does not wet a further protection region; and
    solidifying the at least one further coating material into the further contact structure on the further coating region such that the at least one optoelectronic semiconductor chip is capable of being energized through the further contact structure.

13. The method according to claim 1,
    wherein the at least one electrical contact structure forms an electrically conductive mesh such that the at least one electrical contact structure electrically connects a plurality of optoelectronic semiconductor chips with a common contact point, and wherein applying the at least one liquid coating material comprises applying the at least one liquid coating material over an area.

14. The method according to claim 1, wherein the at least one electrical contact structure forms a contact frame so that a light exit window is formed centrally in the at least one contact side, and wherein the light exit window is framed all around by the at least one electrical contact structure.

15. The method according to claim 1, wherein the at least one electrical contact structure comprises at least one optically effective admixture, and wherein the at least one optically effective admixture is a luminescent substance, a diffuser, a dye, a filtering substance, a thermal conductive substance, a refractive index matcher and/or a thermal expansion matcher.

16. The method according to claim 1, wherein the at least one electrical contact structure is translucent and shaped as a lens.

17. The method according to claim 1, wherein the optoelectronic semiconductor chip comprises a light exit window, wherein the light exit window is surrounded by a contact frame formed by the at least one electrical contact structure in the top view onto the at least one contact side, and wherein the at least one liquid coating material is applied at least in regions to the light exit window and the coating material withdraws from the light exit window before the at least one liquid coating material solidifies into the at least one electrical contact structure.

* * * * *